(12) United States Patent
Belk et al.

(10) Patent No.: US 6,367,053 B1
(45) Date of Patent: Apr. 2, 2002

(54) METHOD AND APPARATUS FOR MODELING ELECTROMAGNETIC INTERACTIONS IN ELECTRICAL CIRCUIT METALIZATIONS TO SIMULATE THEIR ELECTRICAL CHARACTERISTICS

(75) Inventors: Nathan R. Belk, Scotch Plains; Michel Ranjit Frei, Berkeley Heights, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/283,395

(22) Filed: Apr. 1, 1999

(51) Int. Cl.[7] .............................................. G06F 17/50
(52) U.S. Cl. ................. 716/2; 716/5; 716/12; 716/13; 716/14
(58) Field of Search ............................ 703/14; 326/39; 716/2, 5, 12, 13, 14

(56) References Cited

U.S. PATENT DOCUMENTS

| | | | |
|---|---|---|---|
| 5,051,911 A | 9/1991 | Kawasaski et al. | |
| 6,002,860 A | * 12/1999 | Voinigescu | 703/14 |
| 6,130,550 A | * 10/2000 | Zaliznyak | 326/39 |

* cited by examiner

*Primary Examiner*—Matthew Smith
*Assistant Examiner*—Thuan Do (57) ABSTRACT

Metalization structures are modeled by employing automatic substrate grounding and shielding generation in conjunction with a design and simulation process for modeling the charge distributions and the interactions of these charge distributions on metalization structures arising from voltages and currents flowing in metalization structures. By generating and, then, employing a grounding structure that is optimized to strongly screen the metalization structure being designed and simulated, the requirement is eliminated for the accurate incorporation of the strongly dependent long range metalization sub unit to sub unit charge distribution coupling from the charge distribution determination process. In one embodiment of the invention, representative metalization sub units are selected, such as straight sections of infinitesimal length, right angle bends and intersections. Charge distributions are determined in those representative sub units based on the assumption that the integrated circuit substrate strongly suppresses any long range circuit interactions or frequency dependent effects. Then, based on the above assumption, self and mutual interactions are determined of the metalization sub units. Further, based on determined characteristics of those sub units, substrate grounding structures are determined and constructed that ensure the validity of the simulation assumption that the substrate grounding is adequate to strongly suppress any long range circuit interactions and/or frequency dependent effects. The determined self and mutual interactions can then be used as initial solutions to describe all interactions between similar metalization sub units in the overall physical metalization structure to be fabricated.

48 Claims, 5 Drawing Sheets

METHOD AND APPARATUS FOR MODELING ELECTROMAGNETIC INTERACTIONS IN ELECTRICAL CIRCUIT METALIZATIONS TO SIMULATE THEIR ELECTRICAL CHARACTERISTICS

RELATED APPLICATIONS

U.S. patent applications Ser. Nos. 09/283,392, 09/283,393 and 09/283,394 were filed concurrently herewith.

TECHNICAL FIELD

This invention is related to the design of optimized metalization structures and, more particularly, to modeling of electromagnetic interactions in electrical circuit metalizations to simulate the electrical properties of metalization structures in integrated circuits from their physical characteristics and using those electrical properties to obtain improved metalization performance.

BACKGROUND OF THE INVENTION

It is desirable to be able to model quickly and accurately the electrical characteristics of metalization structures, such as inductors, interconnects and the like. It is also desirable to generate metalization structures that minimize the flow of unwanted signals between circuit nodes. Determination of these electrical characteristics requires a detailed solution of the charge density everywhere in the metalization structure combined with an understanding of the extent to which time dependent variations in the charge density will generate unwanted variations in the charge density elsewhere. Because of very rapid three (3) dimensional variation in charge density with position in known metalization structures and because these variations strongly affect the electrical characteristics of the metalizations and because the variations can arise from variations in distant metalization structures, an accurate and fast method for determining those charge distributions and the interactions between those charge distributions is required in order to properly determine the electrical properties of, for example, inductors or other systems of metals. One family of techniques that has been used for this purpose, employs a uniform or variable three (3) dimensional mesh of the entire metalization structure and assumes that the charge distribution will be strongly determined by interactions with adjacent metalization structures at all distances. However, these so-called long range solvers are very inefficient, i.e., slow, when employed in an attempt to model metalization structures that are largely planar as in integrated circuit metalization structures and that are strongly shielded from distant structures. Another family of techniques employs so-called short range solvers that are faster than the long range solvers, but do not account for long range interactions that may be important and, therefore, these short range solvers yield inaccurate results.

SUMMARY OF THE INVENTION

These and other problems and limitations of prior known modeling arrangements and methods are overcome by employing automatic substrate grounding and shielding generation in conjunction with a design and simulation process for modeling the charge distributions and the interactions of these charge distributions on metalization structures arising from voltages and currents flowing in metalization structures. By generating and, then, employing a grounding structure that is optimized to strongly screen the metalization structure being designed and simulated, the requirement is eliminated for the accurate incorporation of the strongly dependent long range metalization sub unit to sub unit charge distribution coupling from the charge distribution determination process.

In one embodiment of the invention, representative metalization sub units are selected, such as straight sections of infinitesimal length, right angle bends and intersections. Charge distributions are determined in those representative sub units based on the assumption that the integrated circuit substrate strongly suppresses any long range circuit interactions or frequency dependent effects. Then, based on the above assumption, self and mutual interactions are determined of the metalization sub units. Further, based on determined characteristics of those sub units, substrate grounding structures are determined and constructed that ensure the validity of the simulation assumption that the substrate grounding is adequate to strongly suppress any long range circuit interactions and/or frequency dependent effects. The determined self and mutual interactions can then be used as initial solutions to describe all interactions between similar metalization sub units in the overall physical metalization structure to be fabricated.

Technical advantages arising from use of applicant's unique shielding arrangement are a significant reduction in the time required to obtain simulation results for modeling the metalization structures, while still maintaining a very acceptable accuracy of results, and the ability to perform the simulation process concurrently with the process of modeling the grounding structure that provides the substrate shielding.

DETAILED DESCRIPTION

Figure 1A:
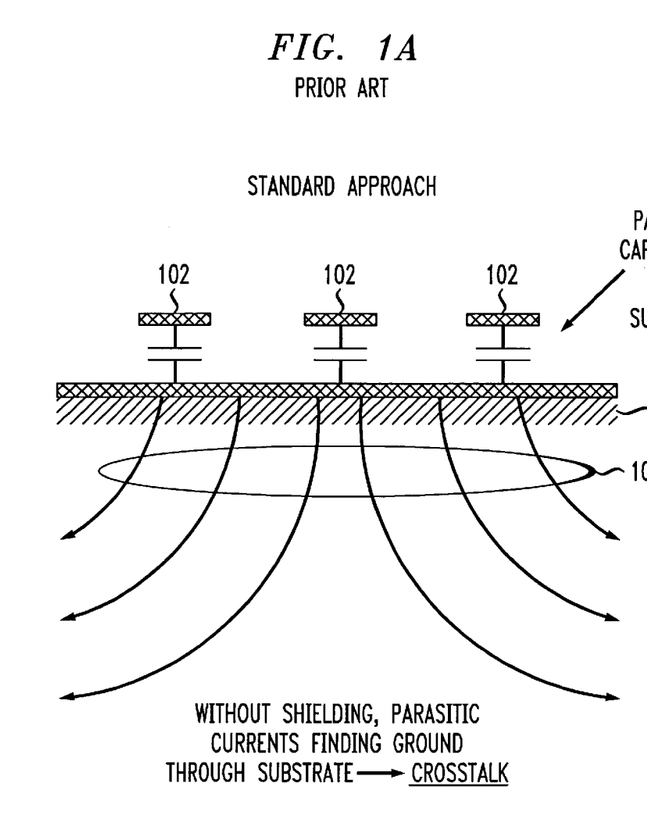
FIG. 1A shows, in simplified form, a cross section of a circuit metals structure fabricated on a substrate without grounding structures and the lines of coupling to adjacent circuit elements.

FIG. 1A shows, in simplified form, a cross section of a prior art circuit metals structure fabricated on a substrate without grounding structures and the lines of coupling to adjacent circuit elements. Shown is the so-called standard approach that does not use substrate shielding to shunt the currents to ground potential. Specifically, shown are substrate 101 without shielding, its parasitic capacitances 102 and currents 103 generated by the unshielded fields arising from the metalization structure finding ground potential through substrate 101. Note that in addition to currents 103 flowing downward through substrate 101 there are similar currents (not shown) flowing upward from substrate 101. Use of this prior so-called standard approach requires a significantly longer time to solve for a desired metalization structure to be fabricated, than by using applicant's unique invention, because of the currents and fields flowing to ground potential through substrate 101 interact strongly with adjacent metalization sub units.

Figure 1B:
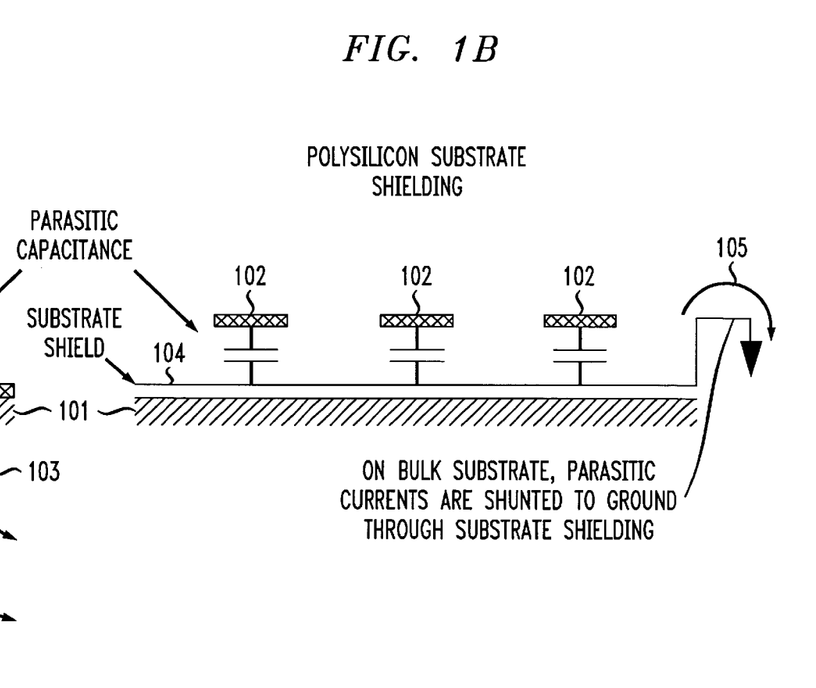
FIG. 1B shows, in simplified form, a cross section of a circuit metals structure fabricated on a substrate with grounding structures and the absence of lines of coupling to adjacent circuit elements.

FIG. 1B shows, in simplified form, a cross section of a circuit metals structure fabricated on a substrate with grounding structures and the absence of lines of coupling to adjacent circuit elements. Shown is the so-called shielding approach of applicant's unique invention that does use substrate shielding to shunt the currents to ground potential, and which establishes a so-called counter charge under the metalization structure. This counter charge is identical to but opposite in sign to the metalization structure's voltage induced charge. Consequently, the counter charge cancels the strong interaction with distant metalization sub units caused by the voltage induced charge. Specifically, shown are substrate 101 with substrate shield 104, its parasitic capacitances 102 and currents 105 finding ground potential through shielding 104. Use of applicant's unique shielding approach yielding a quicker and more accurate approach to simulating a physical metalization structure to be fabricated.

Figure 2A:
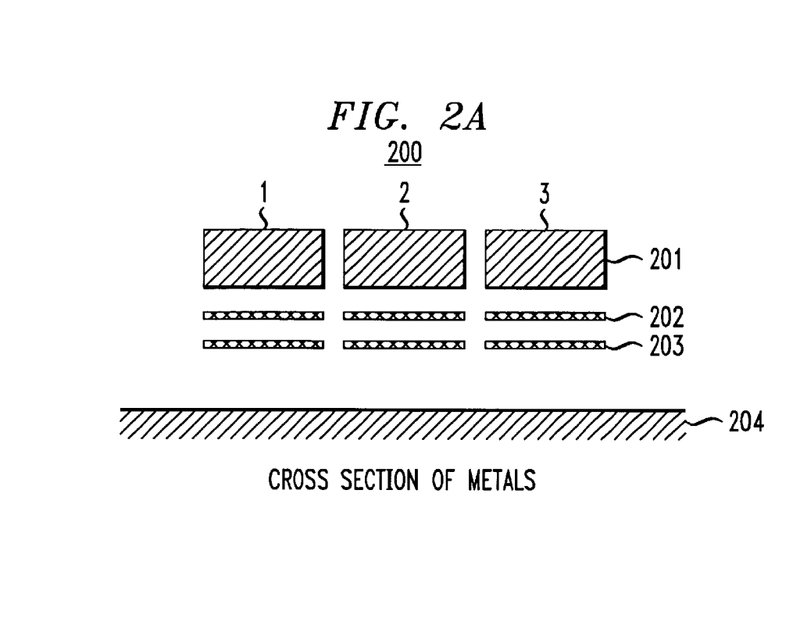
FIGS. 2A through 2C show, in simplified form, an inductor to be fabricated from circuit metalizations, as well as, the cross section of the metalization paths in the inductor.
Figure 2B:
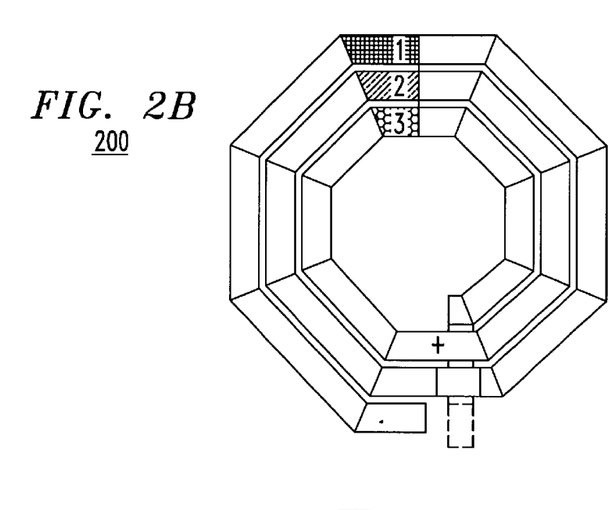
Figure 2C:
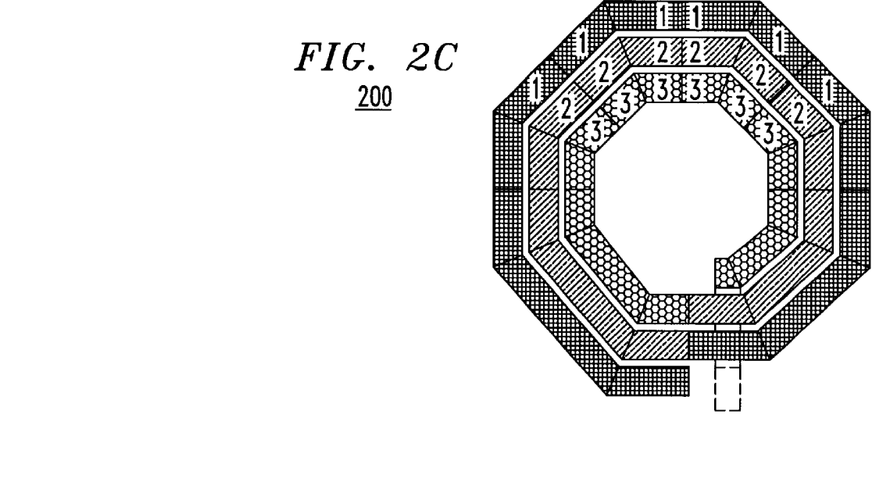

FIGS. 2A through 2C show, in simplified form, an inductor 200 to be fabricated from circuit metalizations, as well as, the cross section of the metalization paths in the inductor. FIG. 2A shows three (3) sub units 1, 2 and 3 of an integrated circuit inductor as shown in FIGS. 2B and 2C. The uppermost metal 201 in each of the sub units is 3 um thick, while the lower metals 202 and 203 are each 0.5 um thick. The sub units 1, 2 and 3 form a portion of the overall integrated circuit inductor 200, which is fabricated on substrate 204. FIGS. 2B and 2C graphically illustrate overall inductor 200 including the representative sub units 1, 2 and 3. Note the high-lighted portions illustrating sub units 1, 2 and 3 in FIGS. 2B and 2C, and that the sub units have been partitioned into smaller sub elements as indicated, for example, by the cross hatching in sub unit 3.

Figure 3:
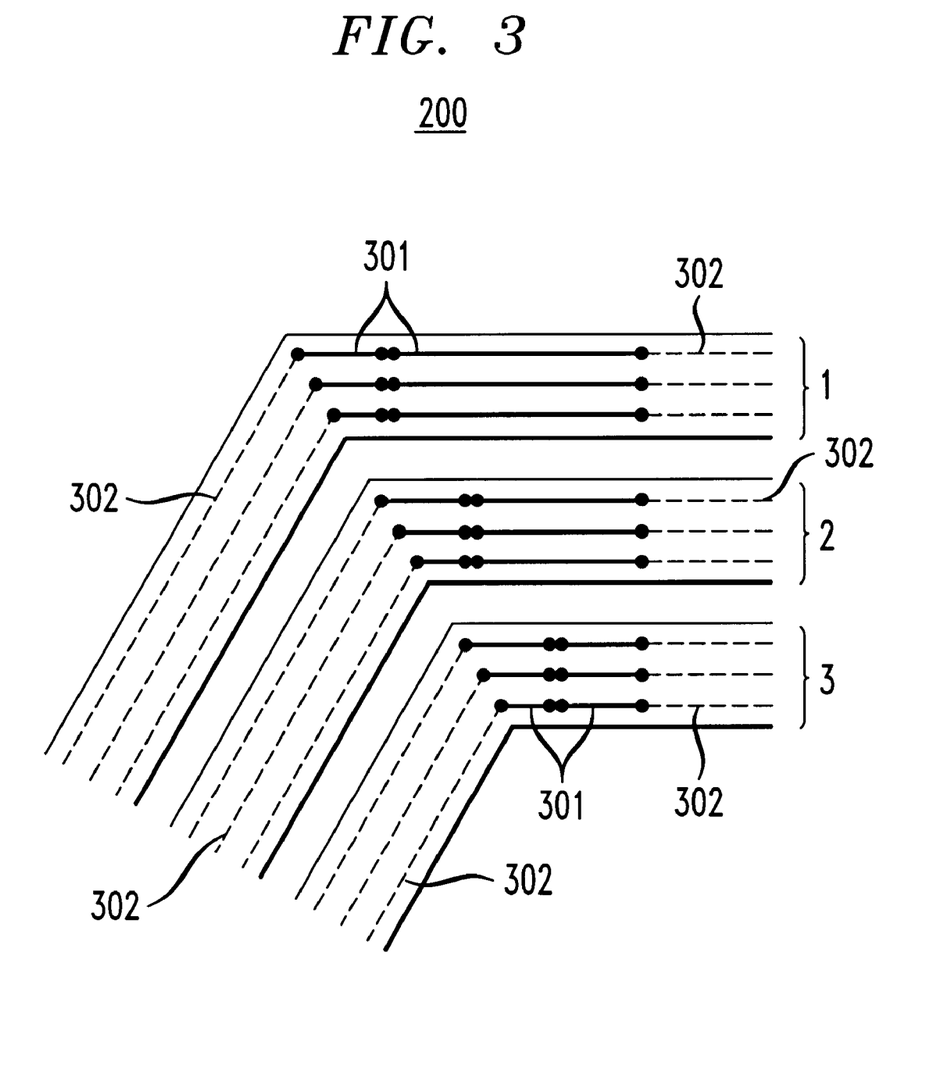
FIG. 3 is a graphical representation illustrating test elements relative to lines of charge/current in a section of the inductor of FIG. 2.

FIG. 3 is a graphical representation illustrating test elements relative to lines of charge/current in a section of the inductor of FIG. 2. Shown are test elements 301, which are in parallel alignment relative the lines of current/charge 302 on a sub unit of inductor 100. Specifically, test elements 301 are in solid outline and delineated at each end solid by a dot, and the lines of charge/current 302 are in dotted outline. In FIG. 3, the test elements 301 and lines of charge/current 302 are shown relative to the groups of sub units 1, 2 and 3 of inductor 100.

Figure 4:
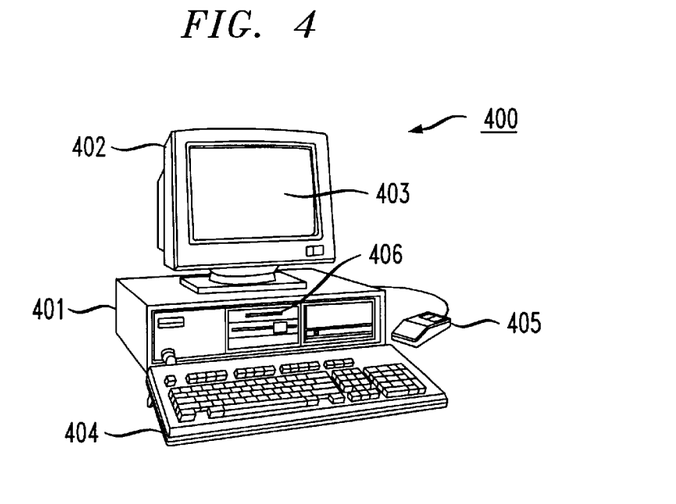
FIG. 4 shows, in simplified form, simulation apparatus including an embodiment of the invention.

FIG. 4 shows, in simplified form, simulation apparatus including an embodiment of the invention. Thus, shown is computer system 400 which may be, for example, a workstation of a type well known in the art, including a central processor, system memory, hard disk and the like (not shown) but housed in cabinet 401. Also included are monitor 402, display unit 403, keyboard 404 and pointing device, i.e., mouse 405. Cabinet 401 also houses a CD-ROM drive 406. The hard disk and system memory are employed in well known fashion to store and retrieve software programs incorporating code for effecting an embodiment of the invention. Additionally, cabinet 401 may also house a floppy disk drive (not shown).

Figure 5:
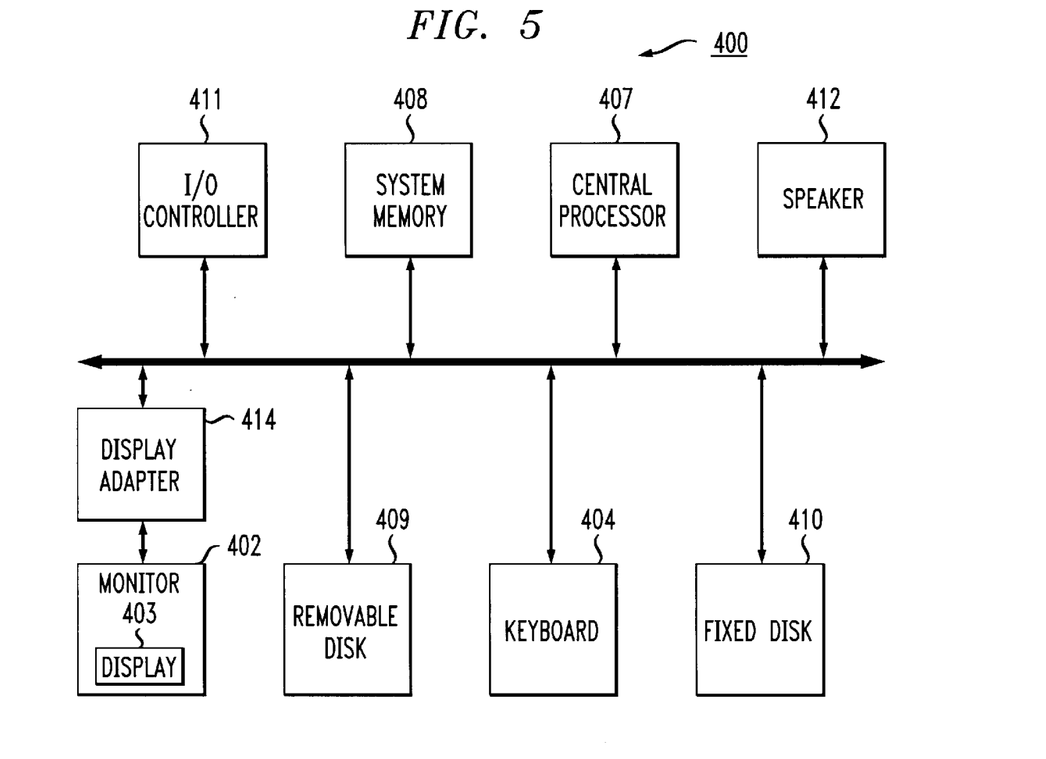
FIG. 5 shows, in simplified block diagram form, details of the apparatus of FIG. 4.

FIG. 5 shows, in simplified block diagram form, details of the apparatus of FIG. 4. Thus, shown is computer system 400 including monitor 402 including display unit 403, display adapter 414, keyboard 404, mouse 405, central processor 407, system memory 408, removable disk drive 409, hard disk drive 410, I/O controller 411 and speaker 412 all interconnected via bus 413. Indeed, FIG. 5 illustrates but one arrangement for implementing an embodiment of the invention and other similar arrangements may be employed to equally practice one or more embodiments of the invention.

Figure 6:
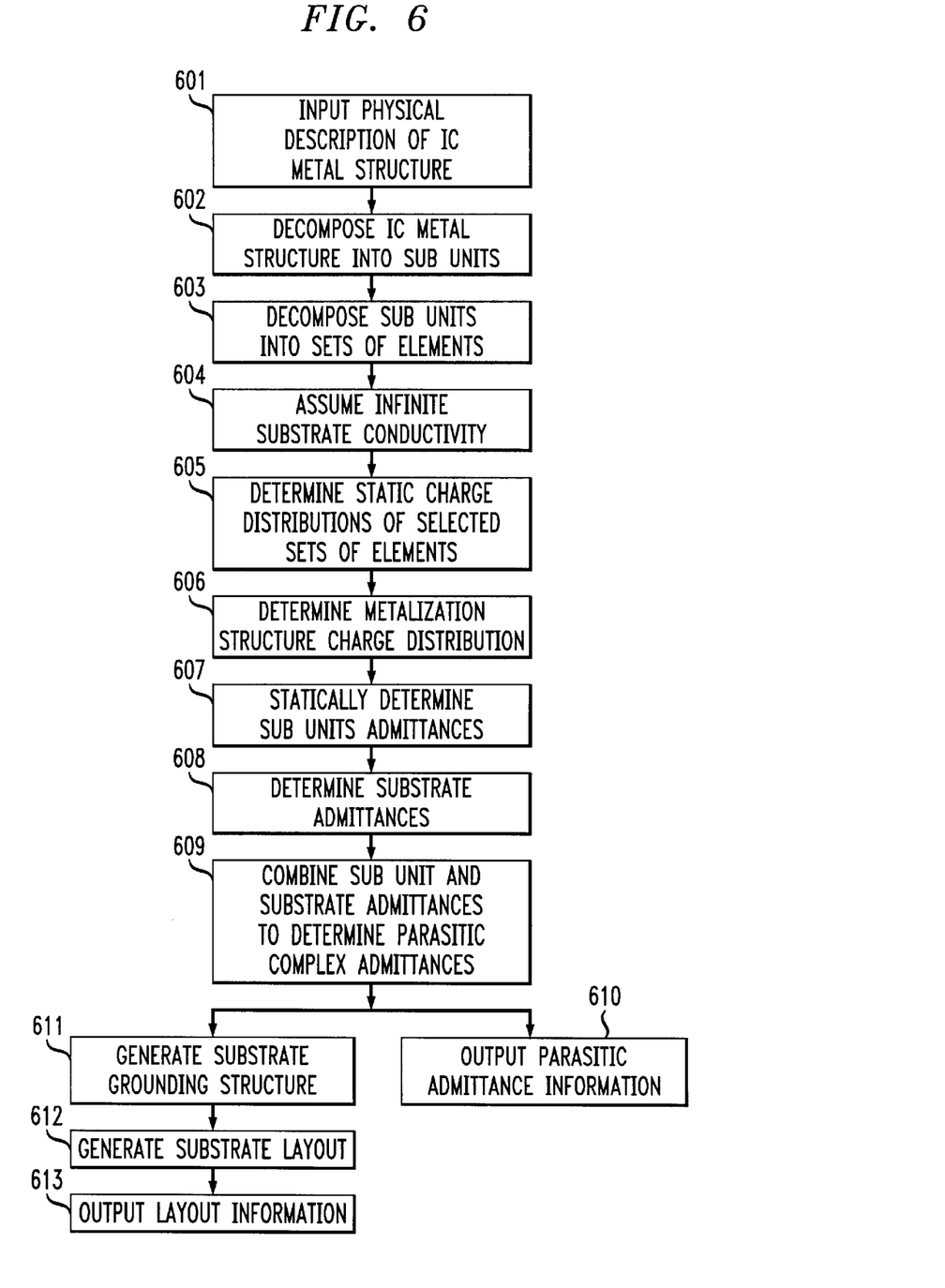
FIG. 6 is a flowchart illustrating steps in one embodiment of a simulation process including an embodiment of the invention.

FIG. 6 is a flowchart illustrating steps in one embodiment of a simulation process including an embodiment of the invention. In this embodiment, the flowchart of FIG. 6 when employed in the simulation apparatus of FIGS. 4 and 5 effects a process and apparatus for modeling metalization structures on substrates by employing substrate grounding and shielding in conjunction with the simulation of charge distributions and interactions on metalization structures.

At this time it is believed that a discussion of the theory of applicant's unique modeling and simulation process is in order. In what follows, test elements are used which are smaller than the charge carrying elements; however, this is not generally required. The field or potential on each of the test elements arising from the charge on the longer elements is determined by the sum of two components. The first component, the self induced potential of a sub unit element of radius $\rho$ whose endpoints are offset by the distances $x_{a,b} = x_{i,a} - x_{j,b}$ in the direction parallel to their lengths is determined by:

$$\Phi s_{i,j} = \frac{1}{2\pi\varepsilon} \sum_{a=-1}^{1} \sum_{b=-1}^{1} (-1)^{1+b} \cdot \left[ \frac{(\rho^2 + x_{i,j})^{3/2} + |x_{i,j}|^3}{3\rho^2} + \frac{|x_{i,j}|}{2} \cdot \log\left(\frac{2 \cdot x_{i,j}}{\rho}\right) \right], \tag{1}$$

where the origin of the coordinate system has been chosen such that $$\sum_{a,b=\pm 1} x_{a,b} = 0.$$

The second component, arising from the coupling of test elements to adjacent lines of charge or the charge images that are separated from the test element can be determined by:

$$\phi_{i,j} = \frac{1}{4\pi\varepsilon} \int_0^i \int_0^j \left[ \frac{1}{|\bar{r}_i - \bar{r}_j|} - \frac{1}{|\bar{r}_i - \bar{r}_j - 2z\bar{z}|} \right] \vec{dl}_i \cdot \vec{dl}_j, \tag{2}$$

where $\bar{r}$ is the location of the observation point, $\bar{r}_j$ is the location of the source and z is the height of the source. In Equation 2, the second term in the brackets enforces the condition of infinite substrate conductivity. Although Equation 2 is useful, in our simulation a closed form expression is used for the interactions between straight elements.

In order to determine the complex admittance matrix for the metalization structure, the potentials are described in the form:

$$\phi_j = (\phi s_{i,j} + \phi s b_{i,j}) q_j + \sum_{i \neq j} q_i (\phi \rho_{i,j} + \phi n \rho_{i,j} + \phi s b_{i,j}). \tag{3}$$

If all sub units in a prescribed group of sub units are solved simultaneously, Equation 3 will run over all charge elements in the three sub units. If the sub units are solved independently Equation 3 need not include terms from more than one sub unit as it is being solved.

The $\phi_j$ are generally the same for all parallel test elements. It is often necessary to find the physical characteristics of the sub units in the external electric potential arising from the charges in other sub units. These external potentials are of the form:

$$\Phi(x_0) + \frac{\partial \Phi}{\partial x} \cdot 2 \frac{(x-x_0)}{ws} + \frac{\partial^2 \Phi}{\partial x^2} \cdot \left(6 \frac{(x-x_0)^2}{ws^2} - \frac{1}{2}\right) + \dots, \quad (4)$$

where x is taken to be along the line which intersects the end of each of the parallel test elements, $x_0$ is at the center of the sub unit, ws is the width of a particular sub unit and adjustments are made to the magnitudes of the potential $\Phi$ and its derivatives. It should be noted that there can be significant variation in magnitude of the charge along the length of the metalization sub unit, consequently, additional terms can be added to Equation 4 to account for these variations. Note, however, that these variations tend to be limited by the screening effects of the substrate.

In structures such as the inductor shown in FIGS. 2B and 2C, the sub unit in each turn can be excited with a voltage independently, the three sub units can be solved for each excitation, and the sub unit charge distribution and electrical properties can then be determined as a function of their self and adjacent turn voltages.

For structures lacking the symmetry of the structure in FIGS. 2B and 2C, it is often desirable to solve Equations 3 and 4 independently for each significant term in the electric potential expansion (Equation 3) so that the dependence of the sub unit charge distribution and, therefore, its electrical properties on the potential or its derivatives can be quantified. Then, in the determination of the overall metalization structure, the effects of the field dependence of a sub unit charge distribution will be accurately represented as it responds to the potential variations generated by the charge distributions in other system sub units.

Because the sub units are small compared to the wavelength of the electrical signal, voltages of the elements in and connected to the sub units is roughly constant so that the whole structure can be assigned a constant voltage during its determination. This constraint is implemented for sub units being excited through requiring that:

$$\phi_i = 1. \quad (5)$$

For sub units that are not being excited, the constraint is:

$$\phi_i = 0. \quad (6)$$

As described above, the simultaneous solution of Equations 1 through 6 allows the field dependent charge distribution of the sub unit to be obtained.

In order to determine the characteristics of the sub unit, the charge distribution on the sub unit is used, as well as, the difference between the sub unit voltage $\phi_i$ on the left of Equation 3 and that of adjacent structures. The complex in field sub unit admittance is determined by the total sub unit charge divided by the sub unit voltage, namely:

$$Y\rho_{i,j} = \frac{qtot_i}{\phi_j}, \quad (7)$$

where $qtot_i$ is the sum of the charge on the region of the charge carrying elements spanned by the test elements.

The mutual interactions between two sub units, for example, A and B, can be determined through:

$$C_{A,B} = \sum_i \sum_j (\phi \rho_{i,j} + \phi n \rho_{i,j} + \phi s b_{i,j}) q_{A,i} \cdot q_{B,j}, \quad (8)$$

where the $q_{A,i}$ and the $q_{B,j}$ are the charges on the $A^{th}$ and $B^{th}$ sub units, respectively.

A more efficient manner for the determining and expressing the mutual interactions between sub units is through multipole decomposition. In this process, the charge distributions on the sub units are decomposed into mathematically orthogonal distribution functions that efficiently capture the differing properties of the components of the charge distributions. These charge distribution functions generate potentials whose spatial dependence is stored in a look up table, and these spatial dependent potentials can then be used to determine the couplings of the adjacent sub units. Following this procedure, the most convenient charge distribution functions are $$f_n = 1, x, \frac{3x^2}{2} - 1/2, \dots$$

The magnitude of the component $a'_n$ of each of the $f_n$ in a sub unit charge distribution is:

$$a'_n = \frac{2n+1}{N} \sum_{i=0}^{N-1} f_n\left(\frac{2i-N+1}{N-1}\right) \cdot q_i, \quad (9)$$

where $a'_n$ then represents the component of the function $f_n$ in the sub unit charge distribution. The potential generated by $a'_n$ is given by:

$$\Phi(\rho/w, \theta) = \frac{N}{4\pi \varepsilon w} \cdot \int_{-1}^{1} \frac{a'_n f_n dx}{(\rho^2 + 2\rho x \cos\theta + x^2)^{1/2}}, \quad (10)$$

where w is the width of the sub units, $\rho$ is the distance to the center of the distribution being represented and $\theta$ is the angle between the charge flow and line between the point current source and observation points. Because these potentials also determine the mutual admittances between sub units, these solutions permit the full determination of the parallel admittances of the overall metalization structure.

A method for determining the variation of the sub unit self and mutual electrical properties that arise from variations in sub unit length is to decompose a sub unit of perturbed length into the sum of the original sub unit plus a short physical extension to the sub unit. The self and mutual electrical characteristics of the sub unit extension can be determined through substitution of the previously determined sub unit charge distribution (found through Equation 3) into Equations 5 to 7 that describe the self and mutual interactions between charge elements that represent the sub unit extension.

The parallel metalization self and mutual admittances of the overall metalization structure are determined through the suitable combination of the representative sub units to form the larger structure and the tabulation of their characteristics and interactions when assembled into the larger structure in the following form:

$$I_{j-1} - I_j = V_j Y \rho_j + 2\pi i f \sum_{i \neq j} (V_j - V_i) C_{i,j}. \quad (11)$$

In Equation 11, $I_{j-1}-I_j$ represents currents that are derived from the series paths through parallel impedances. In Equation 11, the $Y\rho_j$, describing the capacitive and resistive admittances to a grounded substrate are much more important than the $C_{i,j}$, that describe inter sub unit capacitances that describe the inter sub unit capacitances $$C_{i,j} = \sum_n \Phi_n(\rho/w, \theta).$$

The parallel admittances of Equation 11 are then solved for the two (2) port frequency dependent network admittances.

By way of an example, the parasitic admittances and the substrate grounding structures are determined, as described below. In general, impedance Z is given by:

$$Z = R - iX_C \quad (12)$$

and $$|Z| = \sqrt{R^2 + X_C^2}, \quad (13)$$

where $$X_C = \frac{1}{2\pi f C}$$

and for complete screening $X_C \gg R$, $1/Z$ is the complex admittance and $$\frac{1}{Y\rho} = X_C.$$

Consequently, $$|Z| \Rightarrow X_C \sqrt{1 + \frac{R^2}{2X_C^2}} \quad \text{and} \quad (14)$$

the screening level (SL) is $$SL = \frac{i'X_C}{i'X_C + R} \Rightarrow 1 + \frac{i'R}{X_C}. \quad (15)$$

Then, the resistance is set to a maximum value to determine the necessary simulation accuracy, for example, for 90% screening. Consequently, $$\frac{R}{X_C} = 0.1$$

and $$|Z| \approx X_C \left(1 + \frac{R^2}{2X_C^2}\right)$$

and, therefore, in this example, a $\Delta Z$ value to be added is $$\frac{R^2}{2X_C^2} = 0.5\%.$$

In turn, this yields $$\Delta C \approx -\frac{R^2}{2X_C^2} = -0.5\%.$$

Thereafter, a resistance of $$R = \frac{X_C}{10}$$

is added to the sub unit to substrate admittance found above and capacitance is reduced by 0.5% on the sub unit to substrate admittance. Then, the substrate contact area or poly-silicon area is generated by:

$$R = \frac{X_C}{10} = \left(\frac{R_{substrate}}{\pi \ln_i}\right) \log_e\left(\frac{\pi \Delta x}{2 a_f}\right), \quad (16)$$

where $\Delta x$ is the separation from the center of a sub unit to the center of a ground structure, $R_{substrate}$ is the substrate resistivity, and $a_f$ is the average area of the sub unit and the substrate area. Then, $a_f$ is determined as follows:

$$a_f = \frac{\pi \Delta x}{2} e^{\left(\frac{-X_C \pi \ln_i}{10 R_{substrate}}\right)}. \quad (17)$$

Note that in one example, $a_f$ is set for the worst case but the results are typically better than the worst case.

Indeed, then a new value for the parasitic admittance is determined by $Y\rho_j$ of Equation 11. It should be noted that $C_{i,j}$ of Equation 11 is corrected in similar fashion as $Y\rho$.

Alternatively, a grounded poly silicon shield may be fabricated under the metalization structure to provide a very high conductivity layer. In one example, the poly silicon shield is in the shape of a "snow flake" that assures the desired high conductivity.

It should be noted that for each sub unit admittance there typically would be a corresponding substrate admittance and also a corresponding complex admittance. Consequently, one or more sub unit admittances and one or more corresponding substrate admittances may be employed in determining one or more complex admittances. Therefore, at least one (complex) admittance could be one or more (complex) admittances, i.e., just one (complex) admittance or a plurality of (complex) admittances.

Returning to the flow chart of FIG. 6, the process is started in step 601, where the physical description is inputted of the metal structure that is to be fabricated on the conductive substrate. Step 602 causes the inputted metal structure to be decomposed into metalization structure sub units. In step 603 the sub units are decomposed into sets of much smaller sized sub unit elements. Step 604 assumes that the substrate has infinite, i.e., complete, conductivity. In step 605, the static charge distributions of selected sets of elements, i.e., sub elements, is determined. This is realized by employing Equations 1 and 3 through 6. Thereafter, step 606 determines the overall metalization structure charge distribution. This is realized by employing Equations 3 through 6. Step 607 statically determines the sub unit admittances by employing Equations 7, 8 and 10. Then, in step 608 the substrate admittance is determined, as described via the example given above. Step 609 causes the sub unit and substrate admittances to be combined, also as described in the example given above. The parasitic admittance information is supplied as an output via step 610. Step 611 causes the substrate grounding, i.e., screening, structures to be generated. This is also described in the above example and, specifically, by Equations 16 and 17. Then step 612 generates the substrate structure, which is supplied as an output via step 613.

The above-described methods and apparatus are, of course, merely illustrative of the principles of the invention. Indeed, numerous other methods or apparatus may be devised by those skilled in the art without departing from the spirit and scope of the invention.

What is claimed is:

1. A method for use in modeling metalization structures in electrical circuits including a substrate on which the metalization structure is fabricated comprising the steps of:

generating charge and/or current distributions from a source of current distribution on a metalization structure;

setting a prescribed substrate shielding to obtain a prescribed substrate conductivity, said shielding being placed between the metalization structure and the substrate;

shunting parasitic currents from said metalization structure through said shielding to a prescribed potential thereby minimizing long-range interactions between the metalization structures based on underlying characteristics of said charge and/or current distributions that generated said interactions;

statically determining at least one admittance for said metalization structure;

determining at least one admittance for said substrate;

combining said at least one metalization structure admittance and said at least one substrate admittance to generate at least one complex admittance; and utilizing said at least one complex admittance to generate substrate grounding structures forming said shielding for said physical metalization structure to be fabricated, whereby the modeling method converges to correct resulting substrate grounding structures.

2. The method as defined in claim 1 wherein a simulation process for modeling electrical characteristics of said physical metalization structure and generation of said grounding structures are effected simultaneously.

3. The method as defined in claim 1 wherein said substrate shielding is such as to yield complete substrate conductivity.

4. The method as defined in claim 1 wherein said substrate shielding is such as to yield substantially infinite substrate conductivity.

5. The method as defined in claim 1 wherein said at least one complex admittance is at least one parasitic admittance and information of said at least one parasitic admittance is supplied as an output.

6. The method as defined in claim 1 wherein said step of utilizing said at least one complex admittance to generate substrate grounding structures includes generating a substrate contact area for a ground structure utilizing said at least one complex admittance.

7. The method as defined in claim 6 wherein said substrate contact area is dependent on at least a factor related to said at least one complex admittance, on a resistivity of said substrate and a separation distance between the center of a sub unit and the center of a corresponding ground structure.

8. The method as defined in claim 1 further including the step of partitioning of a metalization structure to be fabricated into prescribed metalization structure sub units.

9. The method as defined in claim 8 further including the steps of determining charge distributions of said sub units and utilizing said determined sub unit charge distributions to determine sub unit admittances.

10. The method as defined in claim 9 wherein said step of combining includes combining said sub unit admittances with said at least one substrate admittance to generate said at least one complex admittance.

11. The method as defined in claim 10 wherein said substrate shielding is such as to yield substantially infinite substrate conductivity.

12. The method as defined in claim 11 further including the step of decomposing said sub units into sets of sub elements.

13. The method as defined in claim 12 wherein said step of determining said charge distributions includes the step of determining charge distributions of said sub elements in said sets of sub elements and said step of statically determining includes statically determining admittances of said sets of sub elements.

14. The method as defined in claim 13 wherein said step of combining combines said admittances of said sets of said sub elements with said at least one substrate admittance to generate said at least one complex admittance.

15. The method as defined in claim 14 wherein said step of utilizing said at least one complex admittance to generate substrate grounding structures includes generating a substrate contact area for a ground structure utilizing said at least one complex admittance.

16. The method as defined in claim 15 wherein said substrate contact area is dependent on at least a factor related to said at least one complex admittance, on a resistivity of said substrate and a separation distance between the center of a sub unit and the center of a corresponding ground structure.

17. Apparatus for use in modeling metalization structures in electrical circuits including a substrate on which the metalization structure is fabricated comprising:

means for generating charge and/or current distributions from a source of current distribution on a metalization structure to be fabricated;

means for partitioning of a metalization structure to be fabricated into prescribed metalization structure sub units;

means for setting a prescribed substrate shielding to obtain a prescribed substrate conductivity, said shielding being placed between the metalization structure and the substrate, said shield being connectable to shunt parasitic currents from the metalization structure to a prescribed potential thereby minimizing long-range interactions between the metalization structures based on underlying characteristics of said charge and/or current distributions that generated said interactions;

means for statically determining at least one admittance for said metalization structure;

means for determining at least one admittance for said substrate;

means for combining said at least one metalization structure admittance and said at least one substrate admittance to generate at least one complex admittance; and means for utilizing said at least one complex admittance to generate substrate grounding structures forming said shielding for said physical metalization structure to be fabricated;

whereby the modeling converges to correct resulting substrate grounding structures.

18. The invention as defined in claim 17 wherein a simulation process for modeling electrical characteristics of said physical metalization structure and generation of said grounding structures are effected simultaneously.

19. The invention as defined in claim 17 wherein said initial substrate shielding yields complete substrate conductivity.

20. The invention as defined in claim 17 wherein said initial substrate shielding is such as to yield substantially infinite substrate conductivity.

21. The invention as defined in claim 17 wherein said at least one complex admittance is at least one parasitic admittance and further including means for supplying information of said at least one parasitic admittance as an output.

22. The invention as defined in claim 17 wherein said means for utilizing said at least one complex admittance to generate substrate grounding structures includes means for generating a substrate contact area for a ground structure utilizing said at least one complex admittance.

23. The invention as defined in claim 22 wherein said substrate contact area is dependent on at least a factor related to said at least one complex admittance, on a resistivity of said substrate and a separation distance between the center of a sub unit and the center of a corresponding ground structure.

24. The invention as defined in claim 17 further including means for partitioning of a metalization structure to be fabricated into prescribed metalization structure sub units.

25. The invention as defined in claim 24 further including means for statically determining charge distributions of said sub units and means for utilizing said determined sub unit charge distributions to determine sub unit admittances.

26. The invention as defined in claim 25 said means for combining includes means for combining said sub unit admittances with said at least one substrate admittance to generate said at least one complex admittance.

27. The invention as defined in claim 26 wherein said initial substrate shielding is such as to yield substantially infinite substrate conductivity.

28. The invention as defined in claim 27 wherein said means for partitioning includes means for decomposing said sub units into sets of sub elements.

29. The invention as defined in claim 28 wherein said means for determining said charge distributions includes the means for determining charge distributions of said sub elements in said sets of sub elements and said means for statically determining includes means for statically determining admittances of said sets of sub elements.

30. The invention as defined in claim 29 wherein said means for combining includes means for combining said admittances of said sets of sub elements with said at least one substrate admittance to generate said at least one complex admittance.

31. The invention as defined in claim 30 wherein said means for utilizing said at least one complex admittance to generate substrate grounding structures includes means for generating a substrate contact area for a ground structure utilizing said at least one complex admittance.

32. The invention as defined in claim 31 wherein said substrate contact area is dependent on at least a factor related to said at least one complex admittance, on a resistivity of said substrate and a separation distance between the center of a sub unit and the center of a corresponding ground structure.

33. Apparatus for use in modeling metalization structures in electrical circuits including a substrate on which the metalization structure is fabricated comprising:

a first generator to generate charge and/or current distributions from a source of current distribution on a metalization structure;

an initial prescribed substrate shielding being assumed to obtain a prescribed substrate conductivity, said shielding being placed between the metalization structure and the substrate and being connectable to shunt parasitic currents from the metalization structure to a prescribed potential thereby minimizing long-range interactions between the metalization structures based on underlying characteristics of said charge and/or current distributions that generated said interaction;

a processor to statically determine at least one admittance for said metalization structure and to determine at least one admittance for said substrate;

a combiner to combine said at least one metalization structure admittance and said at least one substrate admittance to generate at least one complex admittance; and first utilization apparatus to use said at least one complex admittance to generate substrate grounding structures forming said shielding for said physical metalization structure to be fabricated, whereby the modeling converges to correct resulting substrate grounding structures.

34. The invention as defined in claim 33 wherein a simulation process for modeling electrical characteristics of said physical metalization structure and generation of said grounding structures are effected simultaneously.

35. The invention as defined in claim 33 wherein said initial substrate shielding yields complete substrate conductivity.

36. The invention as defined in claim 33 wherein said initial substrate shielding is such as to yield substantially infinite substrate conductivity.

37. The invention as defined in claim 33 wherein said at least one complex admittance is at least one parasitic admittance and further including an output for supplying information of said at least one parasitic admittance as an output.

38. The invention as defined in claim 33 wherein said first utilization apparatus includes a generator for generating a substrate contact area for a ground structure utilizing said at least one complex admittance.

39. The invention as defined in claim 38 wherein said substrate contact area is dependent on at least a factor related to said at least one complex admittance, on a resistivity of said substrate and a separation distance between the center of a sub unit and the center of a corresponding ground structure.

40. The invention as defined in claim 33 further including a partitioner for partitioning of a metalization structure to be fabricated into prescribed metalization structure sub units.

41. The invention as defined in claim 40 further including third determination apparatus for determining charge distributions of said sub units and wherein said second determination apparatus utilizes said determined sub unit charge distributions to statically determine sub unit admittances.

42. The invention as defined in claim 41 wherein said combiner further combines said sub unit admittances with said at least one substrate admittance to generate said at least one complex admittance.

43. The invention as defined in claim 42 wherein said initial substrate shielding is such as to yield substantially infinite substrate conductivity.

44. The invention as defined in claim 43 wherein said partitioner further partitions said sub units into sets of sub elements.

45. The invention as defined in claim 44 wherein said third determination apparatus further determines charge distributions of said sub elements in said sets of sub elements and second determination apparatus statically determines admittances of said sets of sub elements.

46. The invention as defined in claim 45 wherein first utilization apparatus for utilizing said at least one complex admittance to generate substrate grounding structures includes means for generating a substrate contact area for a ground structure utilizing said at least one complex admittance.

47. The invention as defined in claim 46 wherein said first utilization apparatus includes a generator for generating a substrate contact area for a ground structure utilizing said complex admittances.

48. The invention as defined in claim 47 wherein said substrate contact area is dependent on at least a factor related to said at least one complex admittance, on a resistivity of said substrate and a separation distance between the center of a sub unit and the center of a corresponding ground structure.

* * * * *